(12) United States Patent
Gaschke et al.

(10) Patent No.: US 6,967,556 B2
(45) Date of Patent: Nov. 22, 2005

(54) HIGH POWER SPACE TRANSFORMER

(75) Inventors: Paul M. Gaschke, Wappingers Falls, NY (US); Franco Motika, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/604,185

(22) Filed: Jun. 30, 2003

(65) Prior Publication Data

US 2004/0263304 A1 Dec. 30, 2004

(51) Int. Cl.⁷ ............................................. H01F 5/00
(52) U.S. Cl. ....................................................... 336/200
(58) Field of Search ........................... 336/83, 200, 232; 439/66, 101; 324/751–762

(56) References Cited

U.S. PATENT DOCUMENTS

| | | | |
|---|---|---|---|
| 3,911,361 A | * | 10/1975 | Bove et al. .................. 324/761 |
| 4,663,604 A | * | 5/1987 | VanSchaick et al. ........... 336/96 |
| 4,734,046 A | * | 3/1988 | McAllister et al. ......... 439/101 |
| 5,207,585 A | | 5/1993 | Byrnes et al. ................. 439/66 |
| 6,198,642 B1 | | 3/2001 | Kociecki ....................... 363/37 |
| 6,313,992 B1 | | 11/2001 | Hildebrandt ................. 361/700 |
| 6,410,858 B1 | * | 6/2002 | Sasaki et al. ............... 174/255 |
| 2001/0032718 A1 | | 10/2001 | Sheerin et al. .............. 165/130 |
| 2002/0014004 A1 | | 2/2002 | Beaman et al. ................ 29/842 |
| 2002/0063327 A1 | | 5/2002 | Chu et al. .................... 257/706 |
| 2002/0093413 A1 | | 7/2002 | Shin'ei ........................ 336/200 |

FOREIGN PATENT DOCUMENTS

| | | |
|---|---|---|
| DE | 3308170 | 9/1983 |
| DE | 19507007 | 10/1996 |
| JP | 10214727 | 8/1998 |
| JP | 2001267153 | 9/2001 |

* cited by examiner

Primary Examiner—Tuyen T. Nguyen
(74) Attorney, Agent, or Firm—Schmeiser, Olsen & Watts; Robert A. Walsh

(57) ABSTRACT

A space transformer for use in an integrated circuit wafer test system, the space transformer including: a ground conductor; a power conductor; and one or more decoupling capacitors physically located between the ground conductor and the power conductor and electrically connected between a bottom surface of the ground conductor and a top surface of the power conductor.

11 Claims, 11 Drawing Sheets

HIGH POWER SPACE TRANSFORMER

BACKGROUND OF INVENTION

1. Field of the Invention

The present invention relates to the field of integrated circuit chip testing; more specifically, it relates to a space transformer for use in a system for testing integrated circuit chips on a wafer.

2. Background of the Invention

Typical wafer level test of integrated circuit chips consists of a set of probes for contacting controlled collapse chip connections (C4s also known as solder bumps) and contact pads of the integrated circuit chip mounted to a space transformer which in turn is mounted to a probe card, the probe card is in turn connected to a tester. The tester supplies power, ground and signals to the integrated circuit chip also known as a device under test (DUT). Three basic problems must be overcome when testing semiconductor integrated circuit chips in this manner. First, the amount of power to be supplied must be sufficient to respond to power surges while transistors and other devices in the integrated circuit chip are switching. Second, as power surges occur, coupling noise on signal lines is generated which must be minimized. Third, with high power consumption integrated circuits unwanted heat generation within the space transformer can occur.

SUMMARY OF INVENTION

A first aspect of the present invention is a space transformer comprising: a ground conductor; a power conductor; and one or more decoupling capacitors physically located between the ground conductor and the power conductor and electrically connected between a bottom surface of the ground conductor and a top surface of the power conductor.

A second aspect of the present invention is a wafer test apparatus comprising: a probe card; a space transformer mounted to the probe card, the space transformer comprising: a ground conductor; a power conductor; and one or more decoupling capacitors physically located between the ground conductor and the power conductor and electrically connected between a bottom surface of the ground conductor and a top surface of the power conductor; and a probe mounted to the space transformer.

A third aspect of the present invention is a space transformer comprising: a ground conductor; a power conductor; one or more additional conductors; one or more decoupling capacitors physically located between the ground conductor and the power conductor and electrically connected between the ground conductor the power conductor and between the ground conductor and the additional conductors; one or more ground pins fixed to and extending from the ground conductor to a top surface of a product die mounted on a top surface of the ground conductor; one or more power pins fixed to and extending from the power conductor to the top surface of the product die; one or more additional pins fixed to and extending from the additional conductor to the top surface of the product die; and one or more signal wires extending from a bottom surface of a board die mounted to a bottom surface of the power conductor to the top surface of the space transformer.

DETAILED DESCRIPTION

The goal of a "good" power delivery system, and this critically includes the space transformer portion of that system, is to provide the device under test (DUT), an integrated circuit chip, with minimal power supply voltage variations throughout the dynamic operating range of the DUT and to minimize inductance and resistance between the power supply and the DUT while at the same time providing sufficient local power storage to supply instantaneous demands of high speed transistor switching. The power delivery system results in an inductance-resistance-capacitance (LRC) network with complex transfer characteristics that vary over a wide signal frequency spectrum. A "good" power delivery system will minimize the inductance and resistance while providing capacitive decoupling.

At low signal frequencies (DC to KHz) the large decoupling capacitors (thousands of $\mu$F) are utilized. At mid signal frequencies (KHz to hundreds of MHz) relatively small (tens of $\mu$F) decoupling capacitors are used. At high signal frequencies (GHz and up) very small (sub $\mu$F) decoupling capacitors that are also very low inductance capacitors (1 nano Henry to 10 pico Henries) are used. While the total inductance between the decoupling capacitor and the DUT must be minimized (and this includes capacitor parasitic, interconnection and probe inductance) for mid signal frequency devices it is especially import to do so for high signal frequencies. The present invention solves these problems by providing a robust ground and power network and by placing the decoupling capacitors very close to the test probes.

A "space transformer" is so called because it transforms the spacing of chip contacts with respect to an integrated circuit chip to a larger spacing that will accommodate printed circuit board (PCB) wiring and/or conventional wires. A chip contact is defined as a C4, solder bump, contact pad, non-solder bump or other electrical chip connection known in the art. The space transformer of the present invention includes six elements that will be illustrated and described in turn.

Figure 1A:
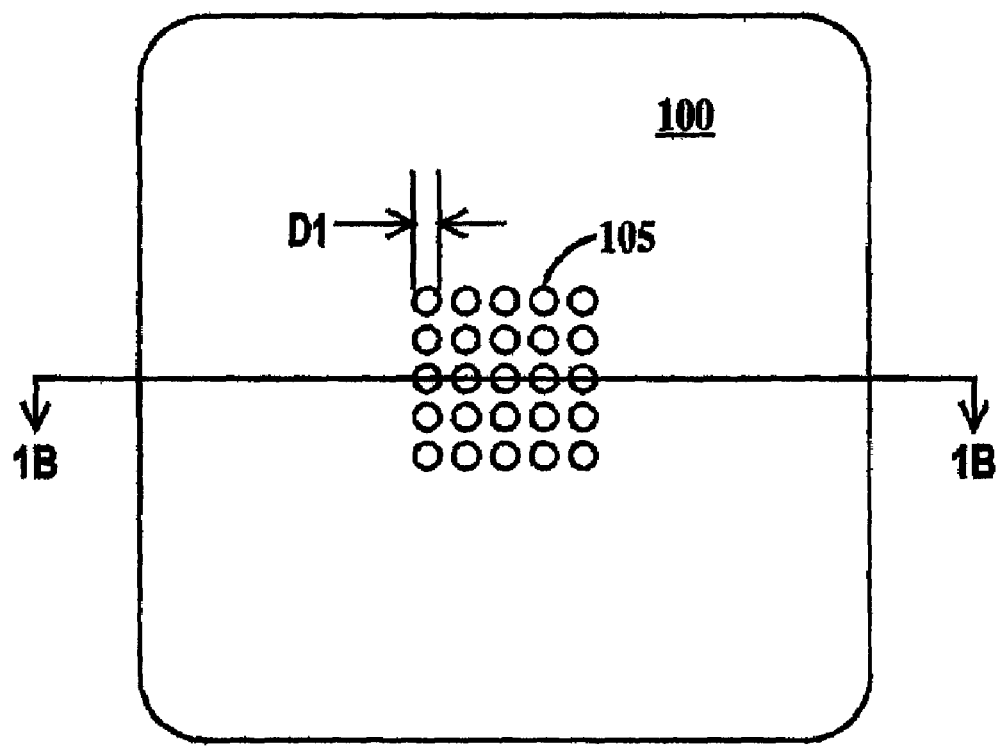
FIG. 1A is a top view and FIG. 1B is a cross-sectional view through line 1B—1B of FIG. 1A of a first element of a space transformer according to the present invention.
Figure 1B:
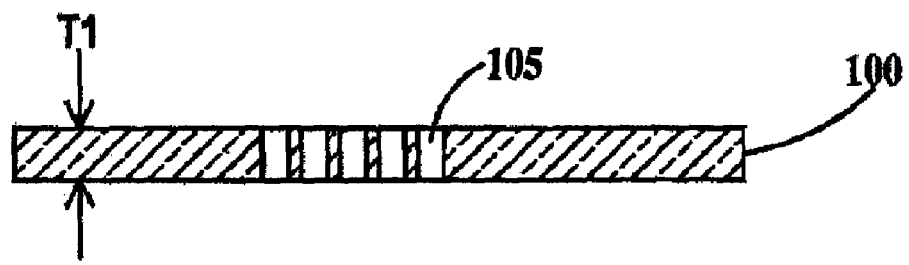

FIG. 1A is a top view and FIG. 1B is a cross-sectional view through line 1B—1B of FIG. 1A of a first element of the space transformer according to the present invention. In FIGS. 1A and 1B, a product die 100 includes a multiplicity of through-holes 105 arranged in the same pattern and to the same pitch (chip contact to chip contact distance) as the chip contacts on an integrated circuit chip to be tested. While an exemplary 5 by 5 array of through-holes 105 is illustrated in FIG. 1A, it should be understood that there may be thousands of chip contacts arranged in any number of patterns on an integrated circuit chip. In one example, through-holes 105 have a diameter D1 of about 0.0055 inches when un-insulated wires and pins are used and about 0.0065 when insulated wires and pins are used, and product die 100 has a thickness T1 of about 0.030 inches. Product die 100 is fabricated from a dielectric material. In one example product die 100 is fabricated from Vespel™ (a polyimide resin), manufactured by Dupont, Wilmington, Del.

Figure 2A:
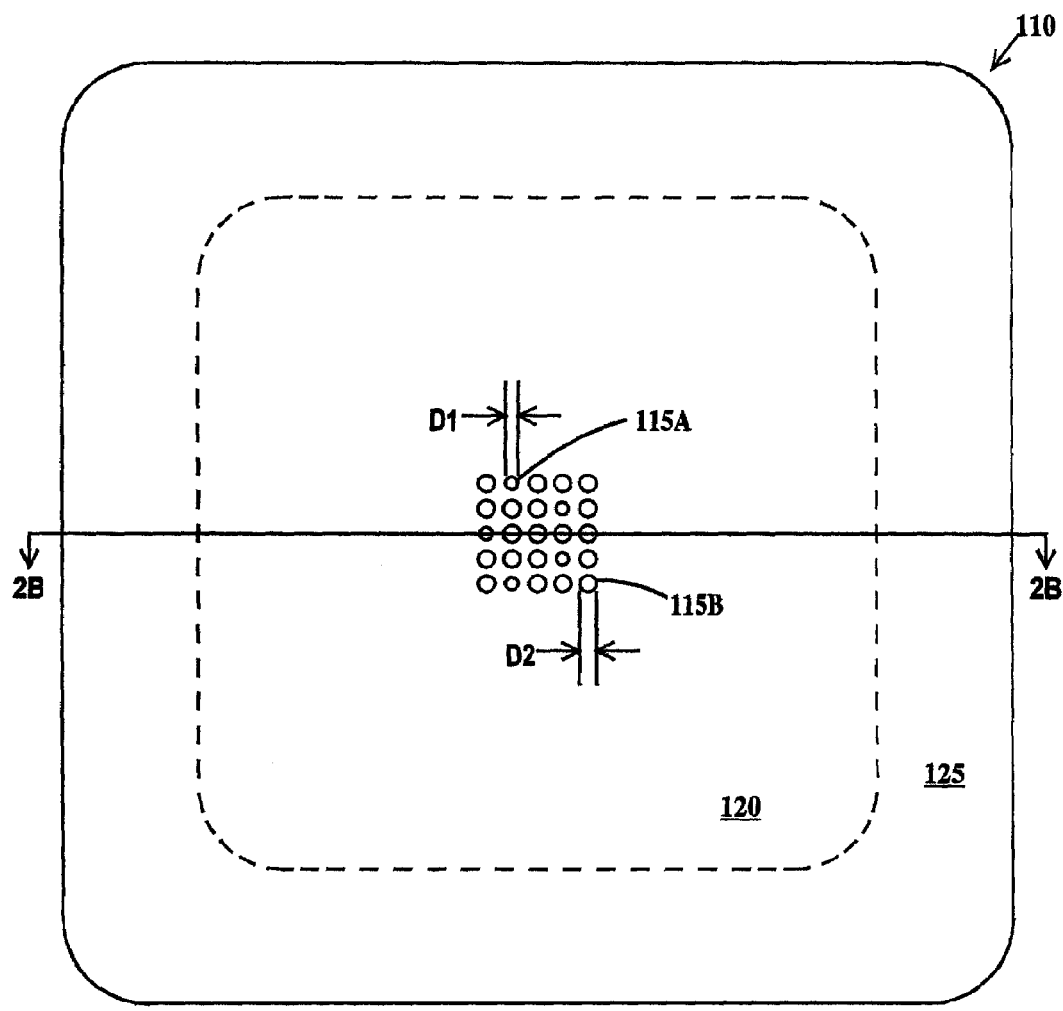
FIG. 2A is a top view and FIG. 2B is a cross-sectional view through line 2B—2B of FIG. 2A of a second element of the space transformer according to the present invention.
Figure 2B:
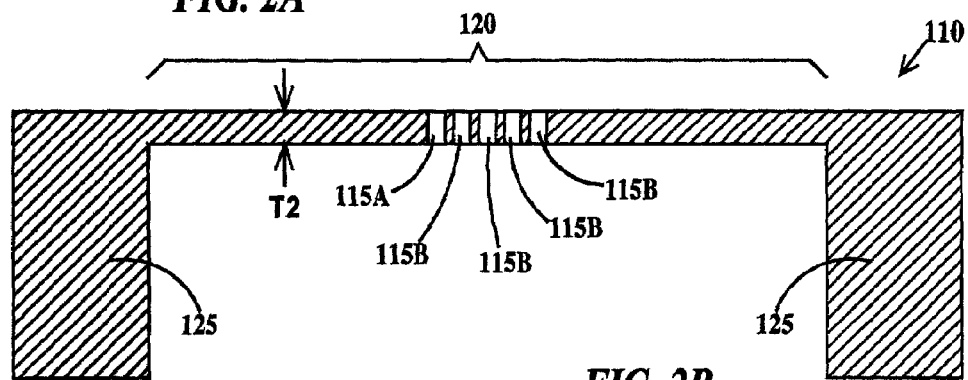

FIG. 2A is a top view and FIG. 2B is a cross-sectional view through line 2B—2B of FIG. 2A of a second element of the space transformer according to the present invention. In FIGS. 2A and 2B a ground conductor 110 includes a multiplicity of through-holes 115 arranged in the same pattern and to the same pitch as through-holes 105 of FIG. 1A. Ground conductor 110 includes an inner region 120, which includes through-holes 115, and an outer region 125. In one example, through-holes 115 have a diameter D1 of about 0.0055 inches and inner region 120 of ground conductor 110 has a thickness T2 of about 0.030 inches. Ground conductor 110 is fabricated from a conductive material. In one example, ground conductor 110 is fabricated from a metal such as copper or aluminum. Ground conductor 110 is (conventionally) electrically connected to a ground terminal of a power supply.

Figure 3A:
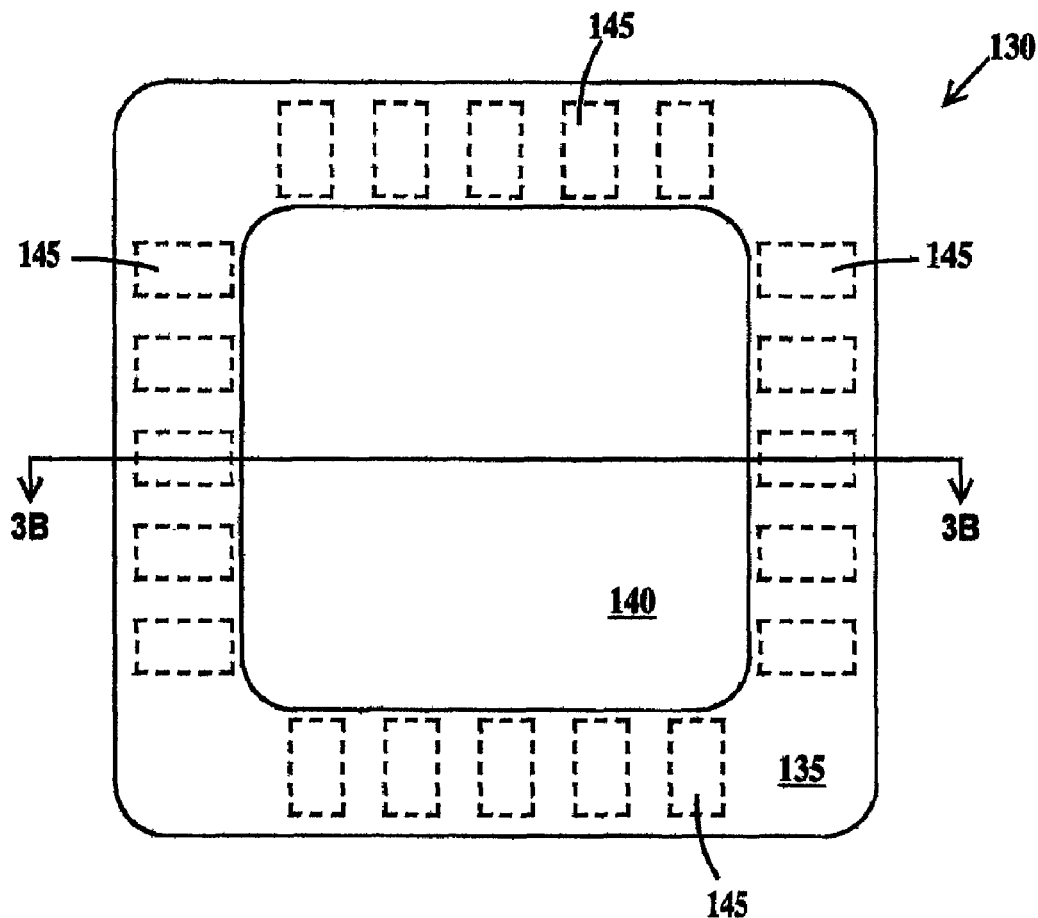
FIG. 3A is a top view and FIG. 3B is a cross-sectional view through line 3B—3B of FIG. 3A of a third element of the space transformer according to the present invention.
Figure 3B:
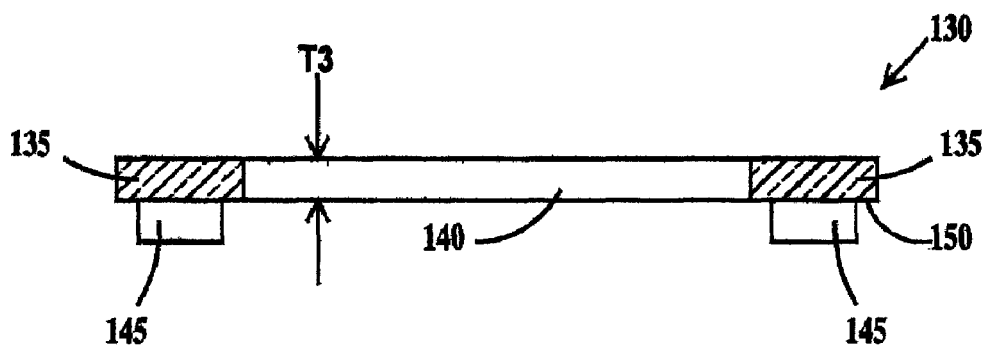

FIG. 3A is a top view and FIG. 3B is a cross-sectional view through line 3B—3B of FIG. 3A of a third element of the space transformer according to the present invention. In FIGS. 3A and 3B, a capacitor board 130 includes a ring 135 surrounding an opening 140 and decoupling capacitors 145 mounted on an underside 150 of ring 135. In one example, capacitor board 130 has a thickness T3 of about 0.012 inches. Capacitor board 100 is abricated from a dielectric material. In one example, product die 130 is a PCB and includes wiring traces (not shown) suitable for mounting decoupling capacitors 145 and interconnecting the decoupling capacitors between ground conductor 110 (see FIGS. 4A, 4B and 7) and a power conductor 155 (see FIGS. 4A, 4B and 7). While only 20 decoupling capacitors are illustrated in FIGS. 3A and 3B, the number of decoupling capacitors is limited only by physical space constraints and can rage up to a hundred or more based on a design that provides the best decoupling. In a first example, decoupling capacitors 145 are low inductance decoupling capacitor arrays (LICA) developed by IBM, Armonk, N.Y. and AVX, Myrtle Beach, Calif. In a second example, decoupling capacitors 145 are multi-layer ceramic capacitors such as 1210 series capacitors. In a third example, decoupling capacitors 145 are IBM proprietary C4 capacitors. In one example, decoupling capacitors 145 can have inductance values ranging from about 1 nano-Henry to about 175 pico-Henries and in a second example for high frequency application, decoupling capacitors 145 can have inductance values of 60 pico-Henries or less.

Figure 4A:
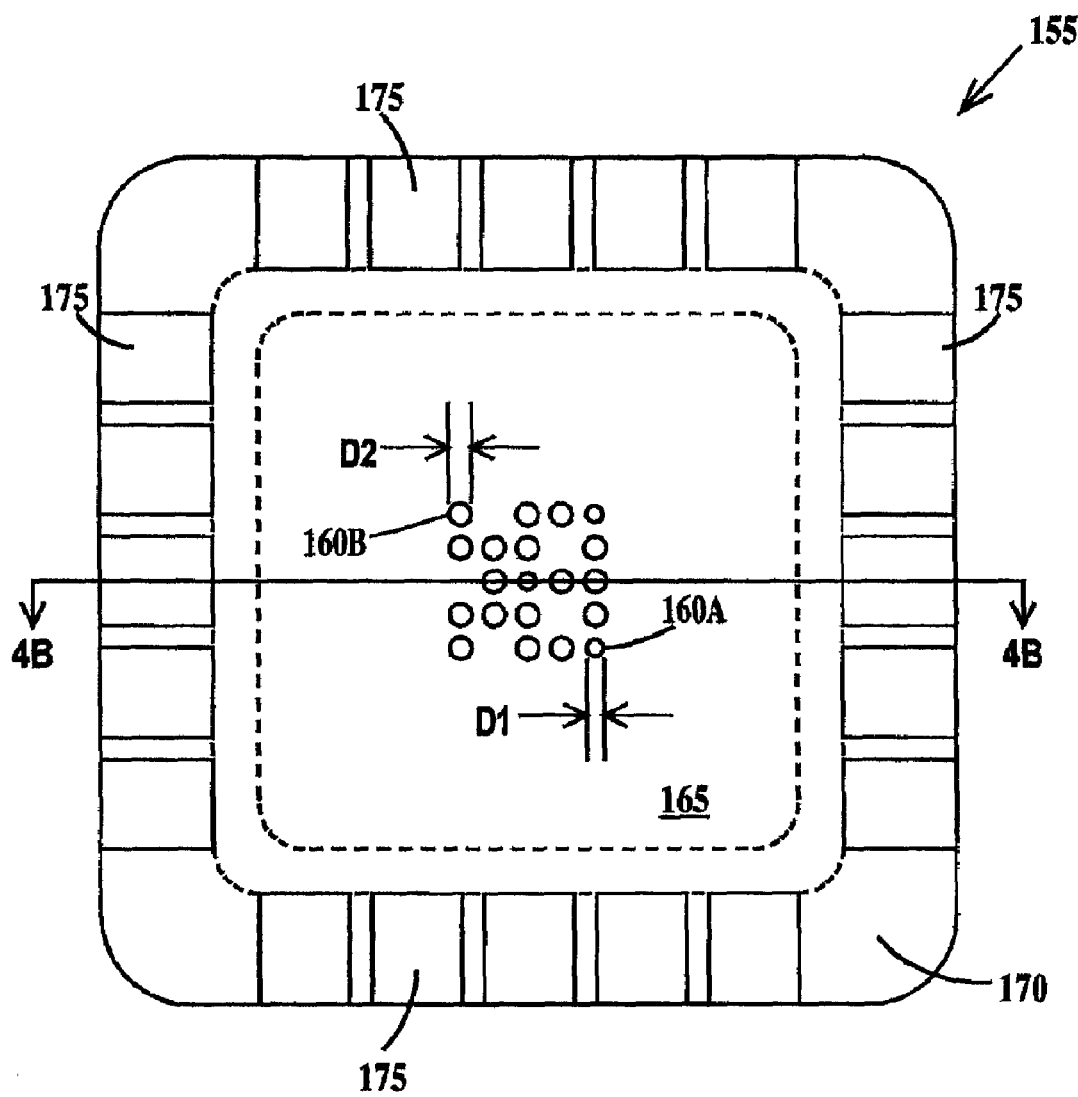
FIG. 4A is a top view and FIG. 4B is a cross-sectional view through line 4B—4B of FIG. 4A of a fourth element of the space transformer according to the present invention.
Figure 4B:
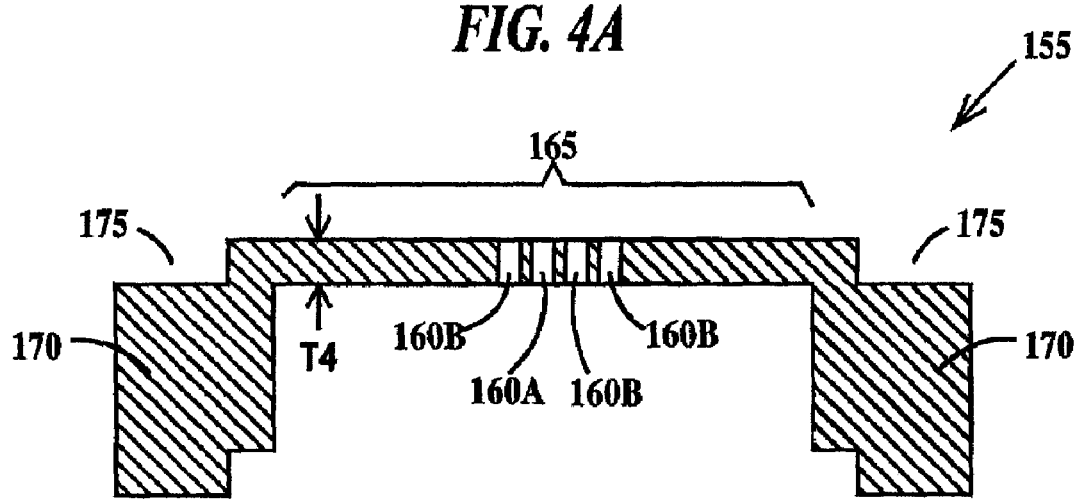

FIG. 4A is a top view and FIG. 4B is a cross-sectional view through line 4B—4B of FIG. 4A of a fourth element of the space transformer according to the present invention. In FIGS. 4A and 4B power conductor 155 includes a multiplicity of through-holes 160 arranged in the same pattern and to the same pitch as through-holes 105 of FIG. 1A with the exception that there is no through-hole 160 in any position corresponding to a chip contact of the integrated circuit chip that carries ground. Power conductor 155 includes an inner region 165, which includes through-holes 160, and an outer region 170 that includes recesses 170 for receiving decoupling capacitors 145 (see FIGS. 3A and 3B). In one example, through-holes 160 have a diameter D1 and inner region 165 of power conductor 155 has a thickness T4 of 0.030 inches. Power conductor 155 is fabricated from a conductive material. In one example, power conductor 155 is fabricated from a metal such as copper or aluminum. Note no through holes 160 are formed in power conductor 155 in chip contact position that will be connected to ground. Power conductor 155 is (conventionally) electrically connected to a power terminal of the power supply.

Figure 5A:
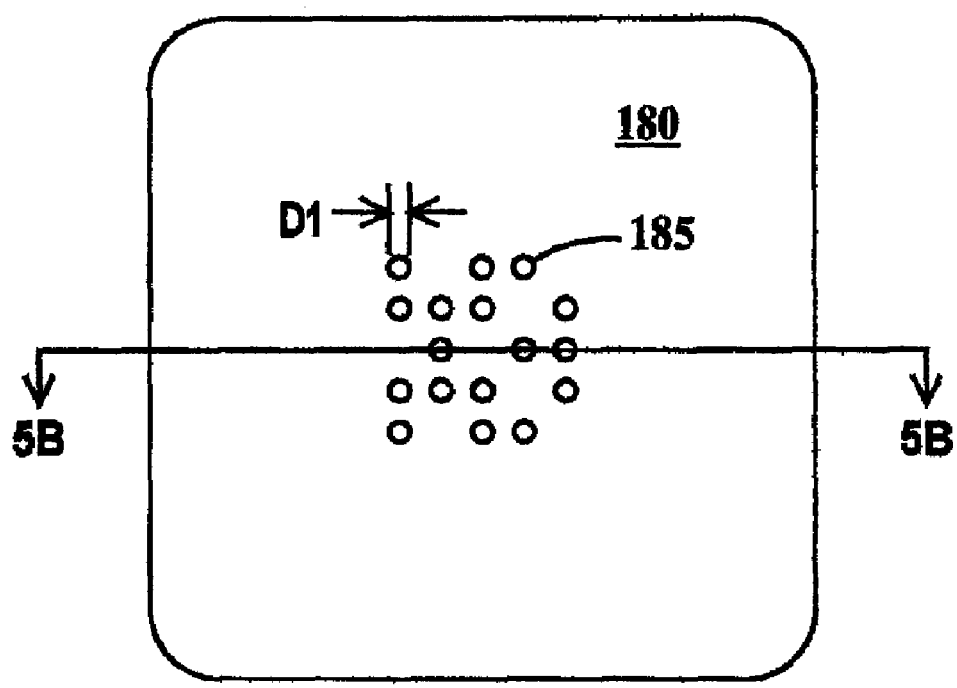
FIG. 5A is a top view and FIG. 5B is a cross-sectional view through line 5B—5B of FIG. 5A of a first element of the space transformer according to the present invention.
Figure 5B:
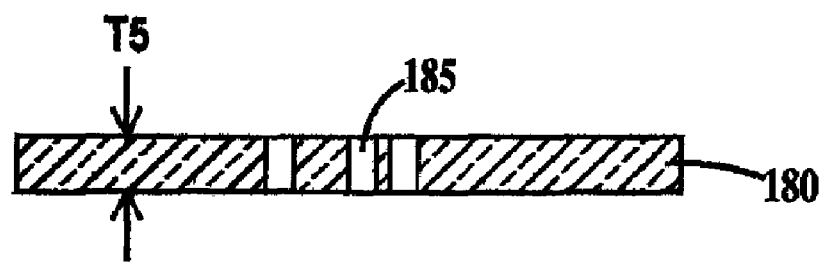

FIG. 5A is a top view and FIG. 5B is a cross-sectional view through line 5B—5B of FIG. 5A of a first element of the space transformer according to the present invention. In FIGS. 5A and 5B, an inner die 180 includes a multiplicity of through-holes 185 arranged in the same pattern and to the same pitch as through-holes 105 of FIG. 1A except there is no through-hole 185 in any position corresponding to a chip contact of the integrated circuit chip that carries ground or power. In one example, through-holes 185 have a diameter D1 and inner die 180 has a thickness T5 of about 0.015 inches. Inner die 180 is fabricated from a dielectric material. In one example, inner die 180 is fabricated from Vespel™. Note no through holes 185 are formed in inner die 180 in chip contact position that will be connected to ground or power.

Figure 6A:
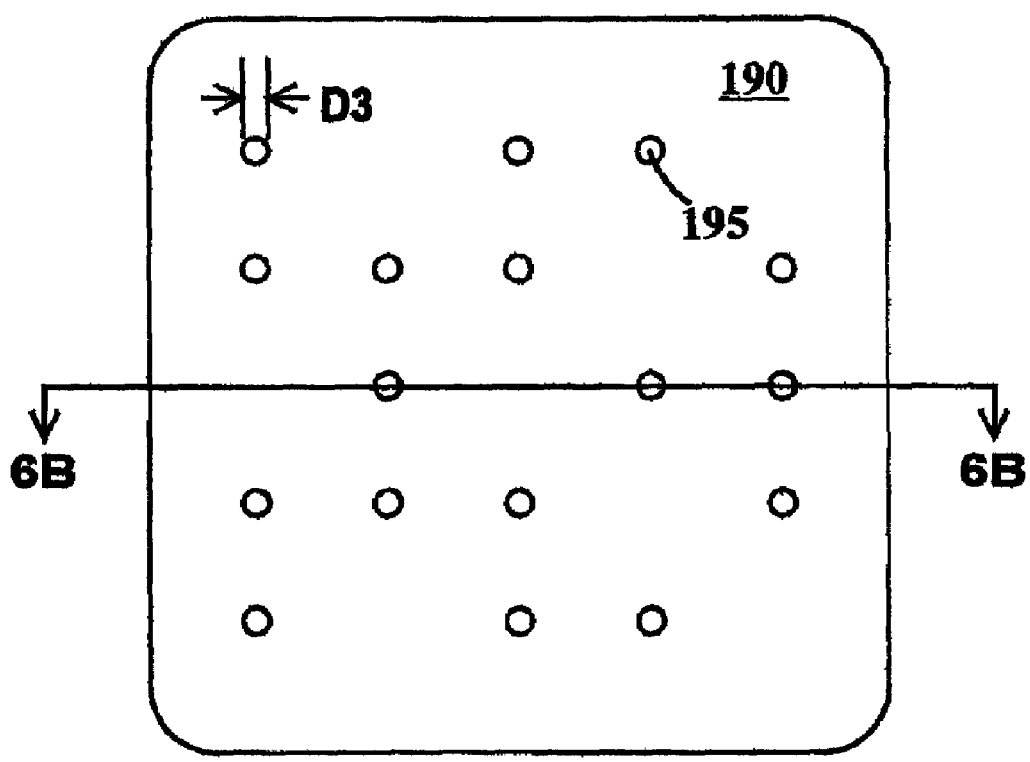
FIG. 6A is a top view and FIG. 6B is a cross-sectional view through line 6B—6B of FIG. 6A of a first element of the space transformer according to the present invention
Figure 6B:
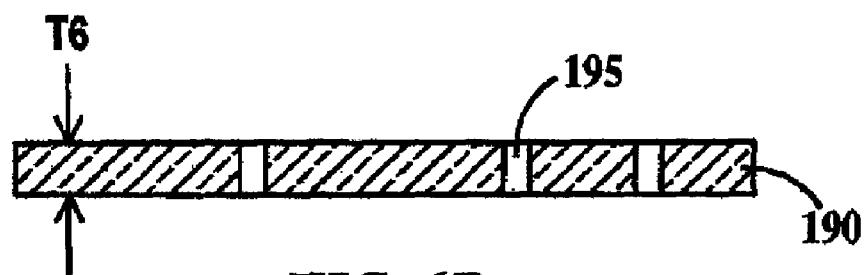

FIG. 6A is a top view and FIG. 6B is a cross-sectional view through line 6B—6B of FIG. 6A of a first element of the space transformer according to the present invention. In FIGS. 6A and 6B, a board die 190 includes a multiplicity of through-holes 195 arranged in a pattern corresponding to the pattern of through-holes 105 of FIG. 1A except there is no through-hole 195 in any sition corresponding to a chip contact of the integrated circuit chip that carries ground or power or is unused and except that the pitch between through-holes 195 is significantly greater than the pitch between through-holes 105. In one example, through-holes 195 have a diameter D2 and board die 190 has a thickness T6 of about 0.020 inches. Board is fabricated from a dielectric material. In one example, board die 190 is fabricated from Vespel™.

Figure 7A:
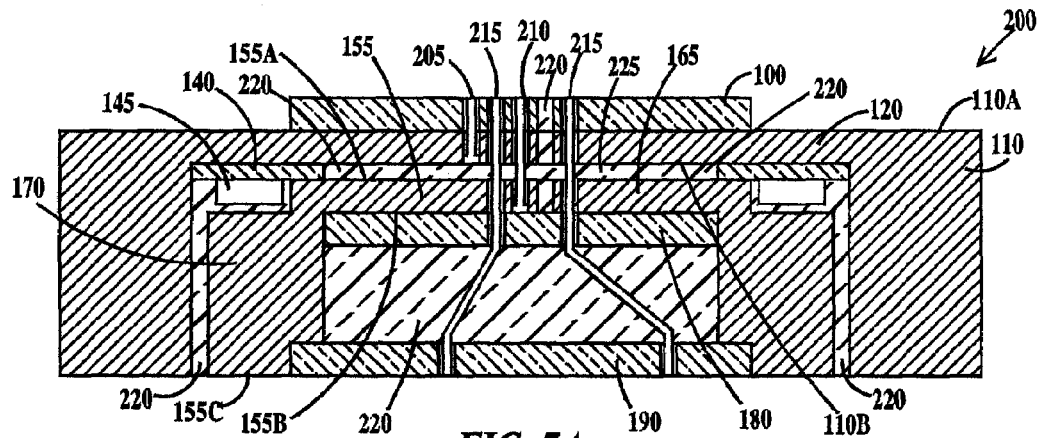
FIG. 7A is cross-sectional view of an assembled space transformer according to the present invention.

FIG. 7A is cross-sectional view of an assembled space transformer according to the present invention. In FIG. 7A, assembled space transformer 200, product die 100, top ground conductor 110, capacitor board 140 (including decoupling capacitors 145), power conductor 155, inner die 180 and board die 190. Assembly fasteners and alignment pins and holes have been omitted for clarity. Product die 100 is mounted on a top surface 110A of ground conductor 110.

Capacitor board 140 is mounted between and in contact with a bottom surface 110B of ground conductor 110 and a top surface 155A of power conductor 155. In the present example, decoupling capacitors 145 are surface mounted (either C4 or SMT) to capacitor board 140 and conductive wires (not shown) in the capacitor board connect a first plate of each decoupling capacitor to ground conductor 110 and a second plate of each decoupling capacitor to power conductor 155. Inner die 180 is mounted to a bottom surface 155B of inner region 165 of power conductor 155 and board die 190 is mounted in notches formed in a bottom surface 155C of outer region 170 of the power conductor. Electrically conductive ground pin 205, power pin 215 and signal wires 215 are described infra with respect to FIG. 7B. A space 225 between inner die 180 and board die 190 is filled with a dielectric material 220. The space between bottom surface 110A of ground conductor 110 and top surface 155A of power conductor 155 is filled with dielectric material 220.

It should be noted that decoupling capacitors 145 are physically located between power conductor 155 and ground conductor 110 reducing to minimum the capacitor interconnect inductance and resistance parasitics. The length of the electrical path between decoupling capacitors 145 and tips of ground pins 205 and power pins 210 at the surface of space transformer 200 is between about 5 to 25 millimeters. The length of the electrical path between the tips of ground pins 205 and power pins 210 at the top surface of space transformer and ground conductor 110 and power conductor 155 respectively is about 1 to 3 mm. Also, because of the thickness of inner regions 120 of ground conductor 110 and inner region 165 of power conductor 155, resistive parasitics are reduced and more current can be carried with reduced voltage drop. Because of the location of decoupling capacitors 145 within space transformer 200, more decoupling capacitance is available than with conventional space transformers.

While one power conductor and one ground conductor are illustrated in FIG. 7A, it is possible for one of ordinary skill in the art to extend the present invention to include a space transformer having more than one power conductor and/or more than one ground conductor stacked in ground/power conductor pairs. Decoupling capacitors could be included between each ground/power conductor pair.

Figure 7B:
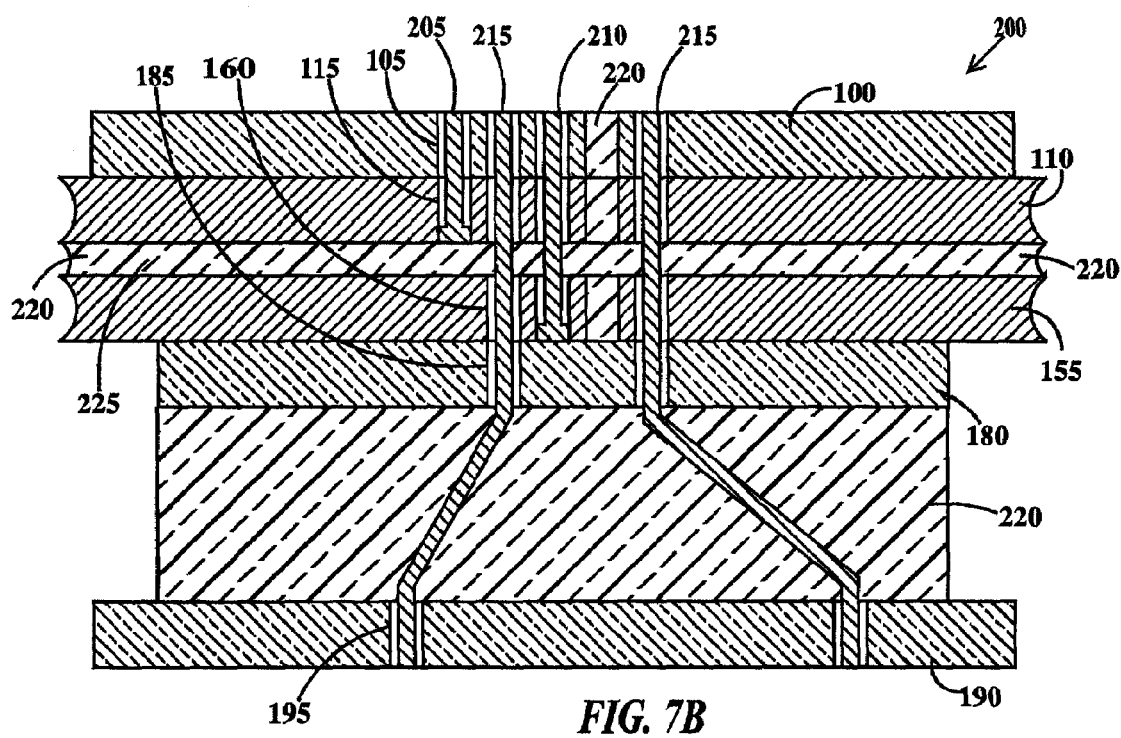
FIG. 7B is an enlarged cross-sectional view of a portion of the assembled space transformer of FIG. 7A.

FIG. 7B is an enlarged cross-sectional view of a portion of the assembled space transformer of FIG. 7A. In FIG. 7B it may be seen that through-holes 105 in product die 100, through-holes 115 in ground conductor 110, through-holes 160 in power conductor 155 and through-holes 185 in inner die 180 are co-aligned. Ground pin 205 is fixed to ground conductor 115 by being pressed (swaged) into through-hole 115 in ground conductor 110 and passes through through-hole 105 in product die 100. Power pin 210 is fixed to power conductor by being pressed (swaged) into through-hole 160 in power conductor 155 and passes through through-hole 115 in ground conductor 110 and through-hole 105 in product die 100. Instead of pressing power and ground pins into their respective conductors, other means to form physical and electric contact between pins and conductors, such as soldering, may be used. Signal wires 215 are fixed in through-holes 195 in board die 190 by dielectric material 220. Signal wires 215 pass through through-holes 185 in inner die 180, through-holes 160 in power conductor 155, through-holes 115 in ground conductor 110 and through-holes 105 in product die 100. Ground pin 205, power pin 210 and signal wires 215 have diameters less than the diameter of through-holes 105, 115, 160 and 185. Ground pins 205, power pins 215 and signal wires 215 are illustrated as un-insulated. Insulated ground pins and/or insulated power pins and/or insulated signal wires or combinations of insulated and un-insulated wires and pins may be used.

Figure 8:
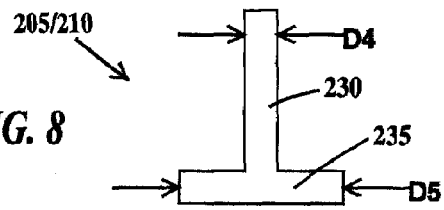
FIG. 8 is a side view of a typical ground or power pin according to the present invention.

FIG. 8 is a side view of a typical ground or power pin according to the present invention. In FIG. 8, ground/power pin 205/210 has an upper region 230 having a diameter of D4 and a bottom region (swage region) having a diameter of D5. In one example, when D1 (see, for example, FIG. 1A) is about 0.0055 inches, D3 is about 0.005 inches and D4 is about 0.006 inches.

Figure 9A:
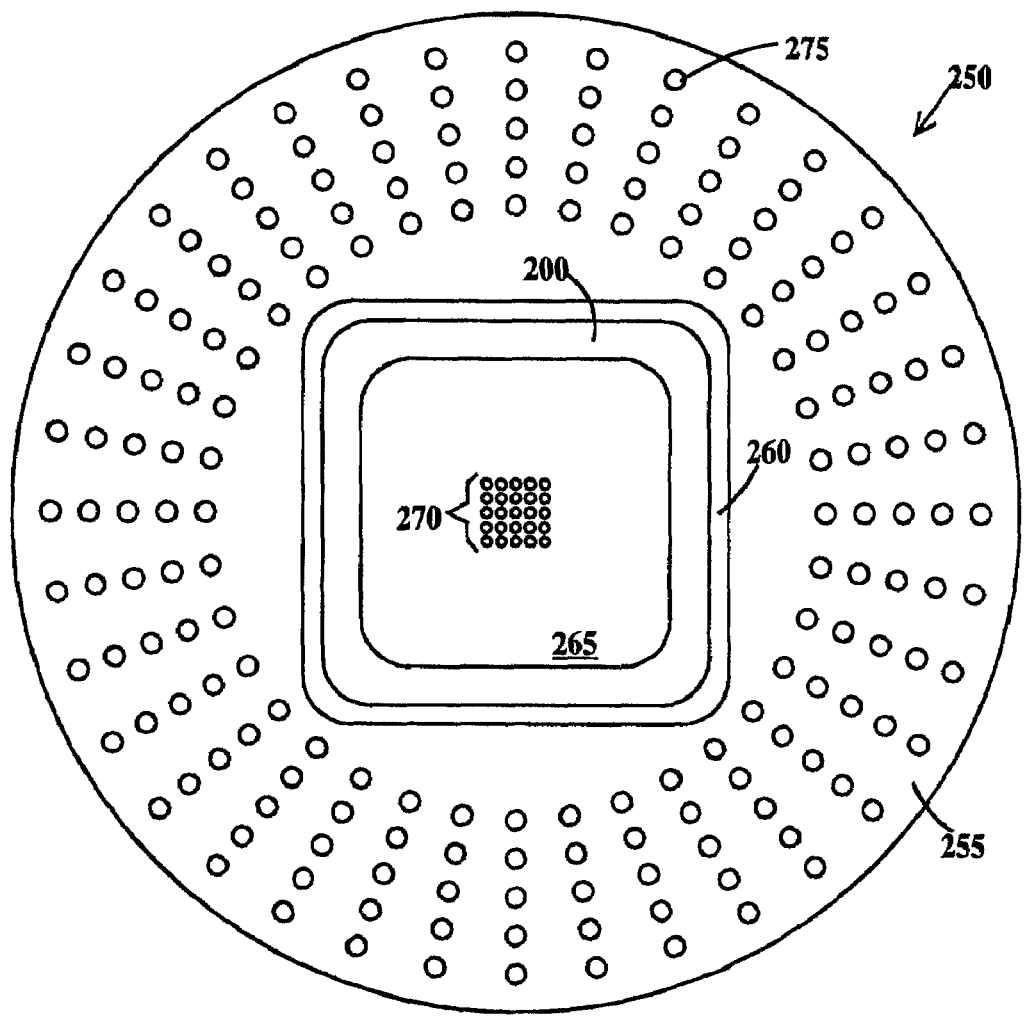
FIG. 9A is cross-sectional view and FIG. 9B is a side view of a probe assembly according to the present invention.
Figure 9B:
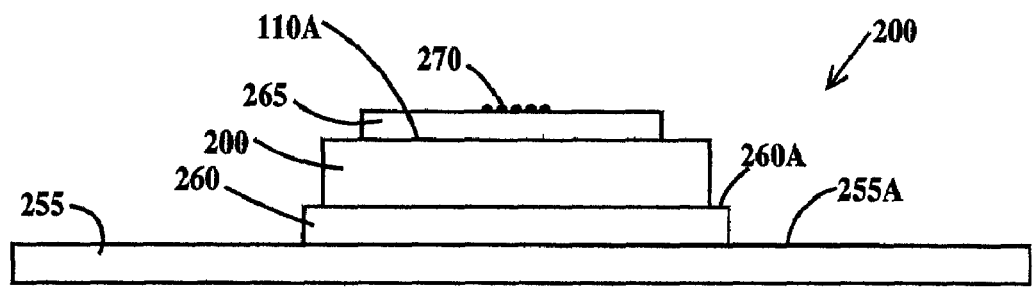

FIG. 9A is cross-sectional view and FIG. 9B is a side view of a probe assembly 250 according to the present invention. In FIGS. 9A and 9B, probe assembly 250 includes a probe card 255, an interposer 260, space transformer 200 and a probe 265. Probe 265 includes an array of probe tips 270 having the same pattern and pitch as the chip contact connectors on a DUT. Probe card 255 includes a multiplicity of interconnects 275 electrically connected to probe tips 270 through interposer 260 and space transformer 200. Interposer 260 interconnects ground conductor 110 (see FIGS. 7A and 7B), power conductor 155 (see FIGS. 7A and 7B) and signal wires 215 (see FIGS. 7A and 7B) to interconnects 275 on probe card 255. A portion of interconnects 275 on probe card 255 are connected to ground conductor 110 (see FIGS. 7A and 7B) and power conductor 155 (see FIGS. 7A and 7B) of space transformer 200 (see FIGS. 7A and 7B). Interconnects 275 are also connected to wires that go to a tester (not shown). Interposer 260 is mounted to a top surface 255A of probe card 255. Space transformer 200 is mounted to a top surface 260A of interposer 260. Probe 265 is mounted to top surface 110A of ground conductor 110 (see FIGS. 7A and 7B) of space transformer 200 (see FIGS. 7A and 7B). Probe tips 270 electrically contact ground pins 205, power pins 210 and signal wires 215 of space transformer 200. Assembly fasteners and alignment pins and holes have been omitted for clarity.

Figure 10:
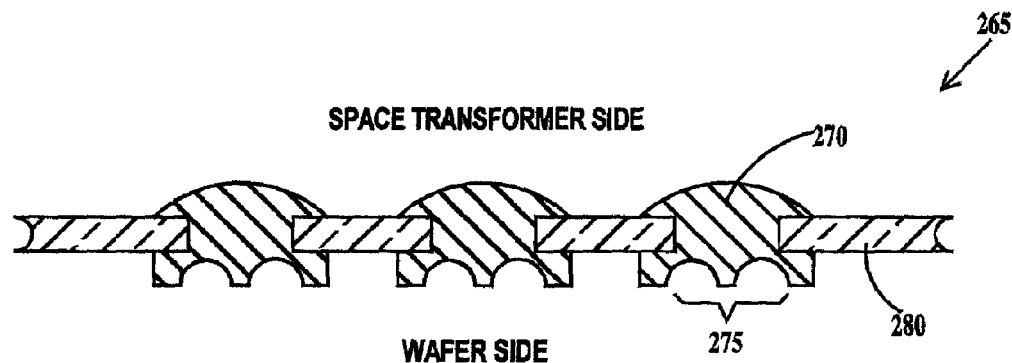
FIG. 10 is a partial cross-sectional view of a thin film interface (TFI probe.

FIG. 10 is a partial cross-sectional view of probe 265. Probe 265 is a thin film interface (TFI) probe. Probe tips 270 interlock in holes 275 in dielectric membrane 280. Other types of probes, for example cantilevered probes (probes where the probes tips extend over the DUT from a support), spring-loaded probes, i.e. COBRA probes, (where an array of spring-loaded contacts is placed over the DUT) and other types of probes equally well known in the art may also be used, but TFI probes have less parasitics and reduce the power, ground an signal electrical path lengths.

Figure 11:
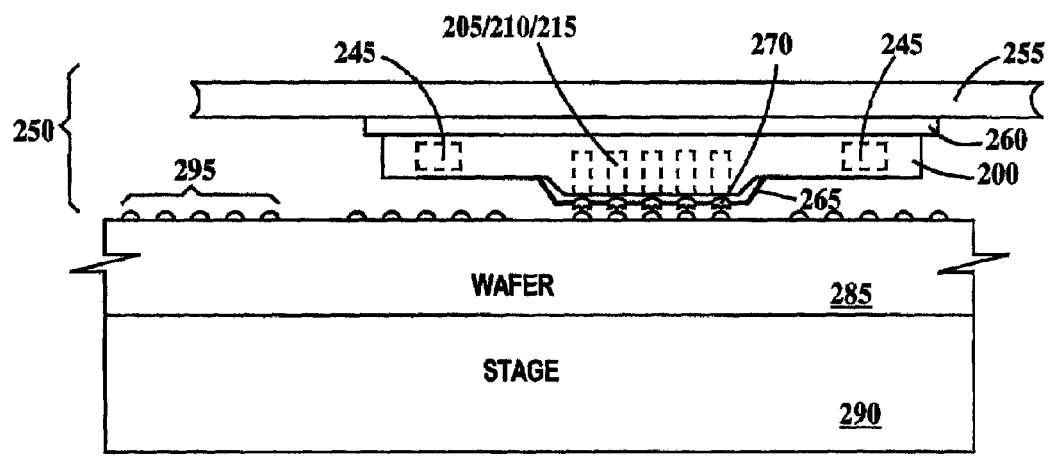
FIG. 11 is a partial side view of an integrated circuit chip wafer under test.

FIG. 11 is a partial side view of an integrated circuit chip wafer 285 under test. In FIG. 11, an integrated circuit chip wafer 285 is held on a stepping stage 290 free to move in two orthogonal co-planer directions as well as rotate about and axis perpendicular to the co-planer directions. Wafer 285 includes an array of chip contact interconnect 295 corresponding to multiple chips on the wafer. Probe tips 270 contact chip contact interconnects 295 and ground pins 205, power pins 210, and signal wires 215 of space transformer 200 when probe assembly 250 and wafer 285 are brought together. Stage 290 allows stepping from one chip to another in order to test all chips on the wafer.

Figure 12A:
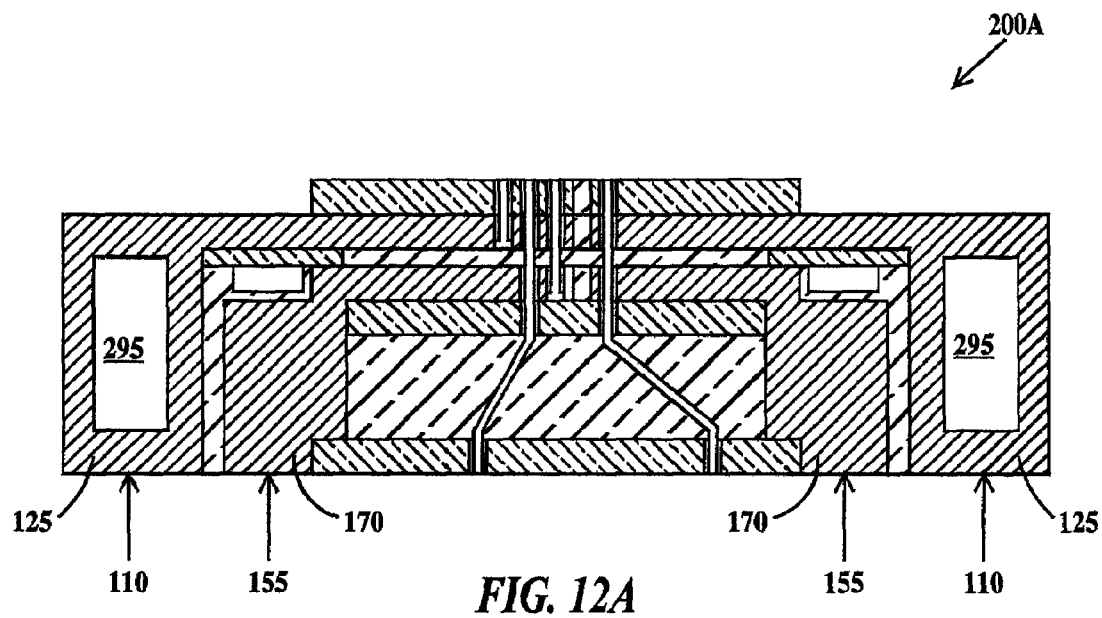
FIG. 12A is cross-sectional view of an assembled space transformer according to a second embodiment of the present invention.

FIG. 12A is cross-sectional view of an assembled space transformer according to a second embodiment of the present invention. In FIG. 12A, space transformer 200A differs from space transformer 200 of FIG. 7A, only in the fact that outer region 125 of ground conductor 110 includes a channel 295 whereby a cooling or heating fluid (liquid or gas) may be circulated to cool or heat not only the space transformer but also the DUT by heat flow through the chip contact interconnects of the DUT.

Figure 12B:
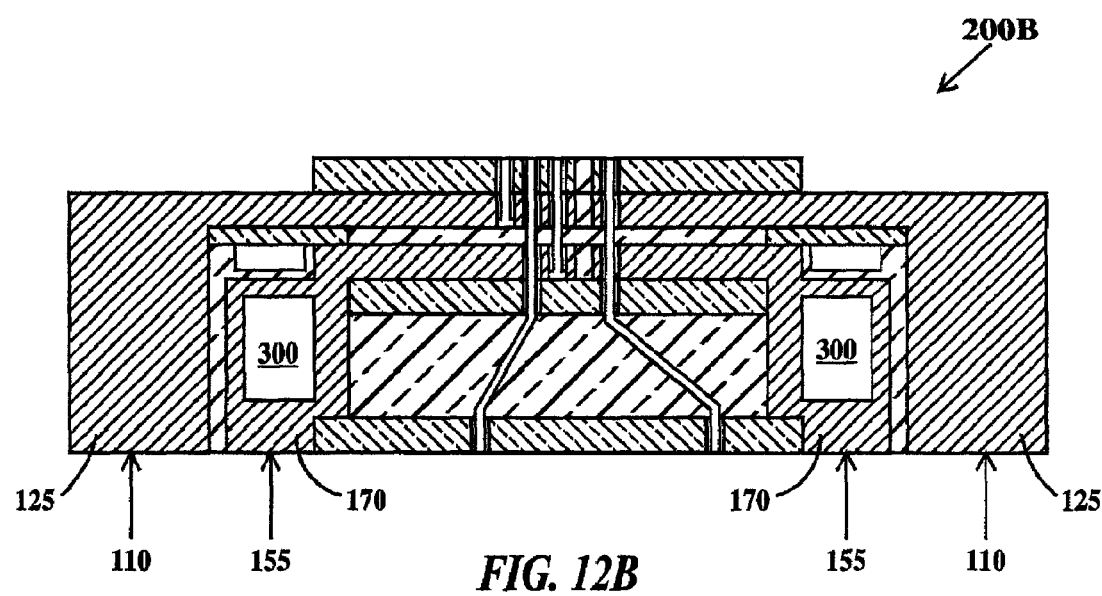
FIG. 12B is cross-sectional view of an assembled space transformer according to a third embodiment of the present invention.

FIG. 12B is cross-sectional view of an assembled space transformer 200B according to a third embodiment of the present invention. In FIG. 12A, space transformer 200B differs from space transformer 200 of FIG. 7A, only in the fact that outer region 170 of power conductor 155 includes a channel 300 hereby a cooling or heating fluid (liquid or gas) may be circulated to cool or heat not only the space transformer but also the DUT by heat flow through the chip contact interconnects of the DUT.

A fourth embodiment of the present invention would include both channel 295 (see FIG. 12A) in outer region 125 of ground conductor 110 and channel 300 (see FIG. 12B) in outer region 170 of power conductor 155.

Figure 13:
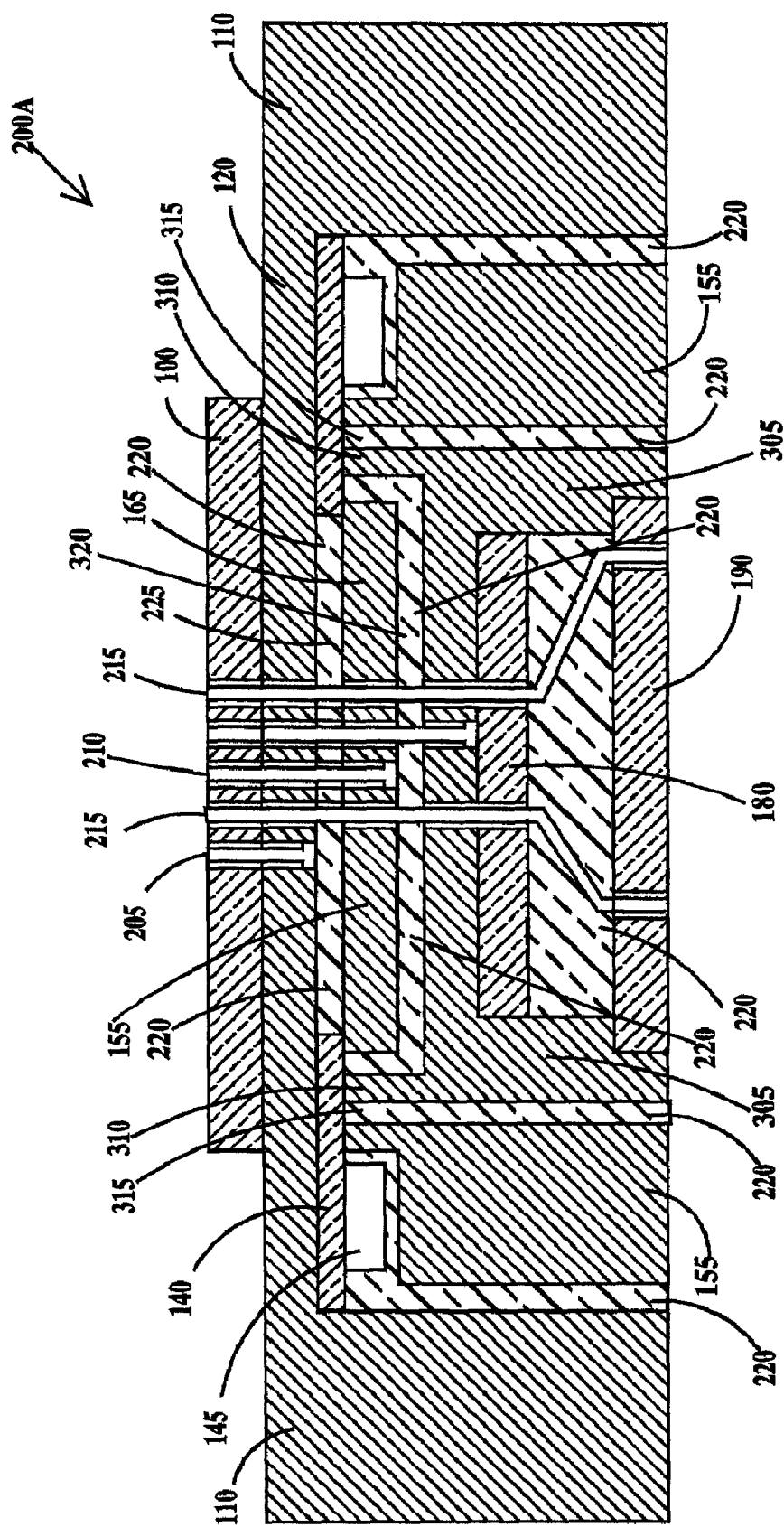
FIG. 13 is a cross-sectional view of an assembled space transformer according to a fifth embodiment of the present invention.

FIG. 13 is a cross-sectional view of an assembled space transformer according to a fifth embodiment of the present invention. In FIG. 13, an additional conductor 305 (which may be electrically connected to power or wound) is positioned between power conductor 155 and inner die 180. Additional conductor 305 electrically contacts capacitor board 140 via extensions 310 passing through through-holes 315 in power conductor 155. A space 320 between power conductor 155 and additional conductor 305 is filled with dielectric material 220. More additional conductors may be added as required in a similar manner as additional conductor 305.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, instead of the ground conductor being electrically connected to the ground terminal of a power supply, ground conductor may be electrically connected to the power terminal of the power supply and instead of the power conductor being electrically connected to the power terminal of the power supply, the power conductor may be electrically connected to the ground terminal of the power supply. The present invention was described with the outermost conductor being electrically connected to the ground terminal of the power supply for safety and to comply with equipment design conventions. Therefore, it is intended that the following claims cover all such modifications and changes as fall within the true spirit and scope of the invention.

What is claimed is:

1. A space transformer comprising:
   a ground conductor;
   a power conductor;
   one or more decoupling capacitors physically located between said ground conductor and said power conductor and electrically connected between a bottom surface of said ground conductor and a top surface of said power conductor,
   one or more ground pins fixed to and extending from said ground conductor to a top surface of said space transformer;
   one or more power pins fixed to and extending from said power conductor to said top surface of said space transformer;
   one or more signal wires extending from a bottom surface of said space transformer to said top surface of said space transformer
   wherein said ground conductor includes an inner region and an outer region, said inner region of said ground conductor having a first thickness less than a second thickness of said outer region of said ground conductor, said ground pins fixed to said inner region of said ground conductor; and
   wherein said power conductor includes an inner region and an outer region, said inner region of said power conductor having a third thickness less than a fourth thickness of said outer region of said power conductor, said power pins fixed to said inner region of said ground conductor.

2. The space transformer of claim 1, wherein said outer region of said power conductor includes a channel for circulation of a coolant or a heating fluid.

3. The space transformer of claim 1, wherein said outer region of said ground conductor includes a channel for circulation of a coolant or a heating fluid.

4. The space transformer of claim 1, wherein said power conductor is disposed interior to said outer regions of said ground conductor.

5. The space transformer of claim 1, wherein:
   said ground conductor is located between said top surface of said space transformer and said power conductor;
   said power conductor is located between said ground conductor and said bottom suface of said space transformer;
   said one or more power pins pass through said ground conductor without electrically contacting said ground conductor; and
   said one or more signal wires pass through both said power and said ground conductors without electrically contacting either of said power or said ground conductors.

6. The space transformer of claim 1, wherein the length of an electrical path between said decoupling capacitors and said one or more ground pins and said one or more power pins at said top surface of said space transformer is between 5 to 25 millimeters.

7. The space transformer of claim 1, wherein the length of an electrical path between tips of said one or more ground pins and said one or more power pins at said top surface of said space transformer and said ground conductor and said power conductor respectively is between 1 to 3 millimeters.

8. The space transformer of claim 1, wherein said decoupling capacitors have an inductance between 175 pico Henries and 1 nano Henry.

9. The space transformer of claim 1, wherein said decoupling capacitors have an inductance less than 60 pico Henries.

10. The space transformer of claim 1, wherein said ground conductor includes an outer region containing a channel for circulation of a coolant or a heating fluid.

11. The space transformer of claim 1, wherein said capacitors are mounted to a circuit board and said circuit board positioned between an outer region of said power conductor and an outer region of said ground conductor.

* * * * *